US012642087B2

(12) United States Patent
Nogami

(10) Patent No.: US 12,642,087 B2
(45) Date of Patent: May 26, 2026

(54) SEMICONDUCTOR DEVICE WITH HEAT SINK HAVING ANCHOR STRUCTURE

(71) Applicant: Mitsubishi Electric Corporation, Tokyo (JP)

(72) Inventor: Yoichi Nogami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 324 days.

(21) Appl. No.: 17/632,496

(22) PCT Filed: Oct. 15, 2019

(86) PCT No.: PCT/JP2019/040533
§ 371 (c)(1),
(2) Date: Feb. 2, 2022

(87) PCT Pub. No.: WO2021/074978
PCT Pub. Date: Apr. 22, 2021

(65) Prior Publication Data
US 2022/0285242 A1 Sep. 8, 2022

(51) Int. Cl.
*H01L 23/367* (2006.01)
*H01L 23/31* (2006.01)
*H01L 23/498* (2006.01)
(52) U.S. Cl.
CPC ...... *H01L 23/3677* (2013.01); *H01L 23/3114* (2013.01); *H01L 23/49827* (2013.01)
(58) Field of Classification Search
CPC ....... H01L 2224/48091; H01L 23/3107; H01L 2224/73221; H01L 23/49541;
(Continued)

(56) References Cited

U.S. PATENT DOCUMENTS 5,747,876 A * 5/1998 Majumdar ............ H01L 25/165
361/716
5,949,649 A * 9/1999 Bartlow .............. H01L 23/4006
361/704
(Continued)

FOREIGN PATENT DOCUMENTS

CN 102347291 A 2/2012
CN 105390452 A 3/2016
(Continued)

OTHER PUBLICATIONS

An Office Action; "Notice of Reasons for Refusal," mailed by the Japanese Patent Office on Aug. 9, 2022, which corresponds to Japanese Patent Application No. 2021-552024 and is related to U.S. Appl. No. 17/632,496; with English language translation.
(Continued)

*Primary Examiner* — David Chen
(74) *Attorney, Agent, or Firm* — Studebaker Brackett PLLC

(57) ABSTRACT

A semiconductor chip (2) is provided on an upper surface (1*a*) of a heat sink (1). A lead terminal (5,6) is electrically connected to the semiconductor chip (2), does not extend above a first side surface (1*c*) of the heat sink (1) but extends above a second side surface (1*d*) of the heat sink (1). Mold resin (10) covers them. A lower surface (1*b*) of the heat sink (1) is exposed from the mold resin (10). An anchor structure (11) in which a lower portion of the first side surface (1*c*) of the heat sink (1) is recessed and is filled with the mold resin (10) is provided. The anchor structure (11) does not exist on the second side surface (1*d*) of the heat sink (1). The heat sink (1) does not protrude from a side surface (10*a*) of the mold resin (10).

8 Claims, 5 Drawing Sheets

(58) Field of Classification Search

CPC ........... H01L 23/49575; H01L 23/3114; H01L 23/3142; H01L 23/49503; H01L 23/49548; H01L 23/495; H01L 23/3677; H01L 23/49827

USPC ......... 257/99, 666, 670, 672, 675, 676, 690; 438/26, 112, 122

See application file for complete search history.

(56) References Cited

U.S. PATENT DOCUMENTS

| | | | |
|---|---|---|---|
| 6,188,130 B1 * | 2/2001 | Ramirez ............... | H01L 23/367 257/713 |
| 6,562,660 B1 | 5/2003 | Sakamoto et al. | |
| 6,756,658 B1 * | 6/2004 | Gillett ..................... | H01L 24/49 257/676 |
| 2004/0113248 A1 * | 6/2004 | Ito ......................... | H05K 3/3426 257/E23.092 |
| 2009/0140403 A1 * | 6/2009 | Lim ......................... | H01L 24/83 257/676 |
| 2012/0001311 A1 * | 1/2012 | Nishino ............ | B29C 45/14311 257/676 |
| 2012/0025359 A1 | 2/2012 | Tomaru | |
| 2014/0077345 A1 * | 3/2014 | Uno .................. | H01L 23/49568 257/664 |
| 2014/0225239 A1 | 8/2014 | Kimura | |
| 2016/0064312 A1 * | 3/2016 | Bando .............. | H01L 23/49575 438/119 |
| 2016/0276175 A1 * | 9/2016 | Kotokawa ......... | H01L 23/49503 |
| 2018/0033932 A1 * | 2/2018 | Beh ................... | H01L 23/49548 |
| 2020/0227363 A1 | 7/2020 | Asada et al. | |

FOREIGN PATENT DOCUMENTS

| | | | |
|---|---|---|---|
| JP | 2001-053212 A | 2/2001 | |
| JP | 2007-165692 A | 6/2007 | |
| JP | 2009-238805 A | 10/2009 | |
| JP | 2012-033665 A | 2/2012 | |
| JP | 6289792 B1 | 3/2018 | |
| TW | 567738 B | 12/2003 | |
| TW | 201448127 A | 12/2014 | |
| TW | 201508875 A | 3/2015 | |
| TW | 201827612 A | 8/2018 | |
| WO | WO-2013061603 A1 * | 5/2013 | ............. H01L 21/56 |

OTHER PUBLICATIONS

An Office Action mailed by the Korean Intellectual Property Office on Jun. 20, 2023, which corresponds to Korean Patent Application No. 10-2022-7010912 and is related to U.S. Appl. No. 17/632,496; with English language translation.

International Search Report issued in PCT/JP2019/040533; mailed Dec. 24, 2019.

An Office Action issued by Taiwanese Patent Office on Nov. 18, 2020, which corresponds to Taiwanese Patent Application No. 109133815; with partial English language translation.

An Office Action issued by Taiwanese Patent Office on Jul. 9, 2021, which corresponds to Taiwanese Patent Application No. 109133815; with partial English language translation.

An Office Action mailed by China National Intellectual Property Administration on Feb. 22, 2025, which corresponds to Chinese U.S. Appl. No. 17/632,496.8 and is related to U.S. Appl. No. 17/632,496; with English language translation.

* cited by examiner

SEMICONDUCTOR DEVICE WITH HEAT SINK HAVING ANCHOR STRUCTURE

FIELD

The present disclosure relates to a semiconductor device of a resin mold package type.

BACKGROUND

In a semiconductor device of a resin mold package type, a semiconductor chip is provided on a heat sink, and the semiconductor chip and a lead terminal are connected to each other with a wire, and are covered with mold resin. In the semiconductor device, a heat sink having an anchor structure in which a lower portion of its side surface is recessed and is filled with mold resin has been used. This makes it possible to prevent the heat sink from dropping from the mold resin, thereby ensuring reliability.

When the anchor structure exists below the lead terminal, an inductance increases. Accordingly, impedance of the lead terminal cannot be decreased to a desired level. Therefore, a higher performance is inhibited in cases such as a case where the semiconductor device is used as a high-frequency amplifier. To solve this problem, a semiconductor device in which a heat sink having a side surface a part of which protrudes from mold resin below a lead terminal is used to decrease the impedance of the lead terminal has been proposed (see, e.g., Patent Literature 1).

CITATION LIST

Patent Literature

[Patent Literature 1] JP 6289792

SUMMARY

Technical Problem

In molding, two metal molds for molding separated in a vertical direction with a lead terminal in a semiconductor device used as a boundary are used. After mold resin is injected and charged into the molds from an injection port, the two molds are separated from each other in the vertical direction. However, in manufacturing a conventional semiconductor device in which a part of a side surface of a heat sink protrudes from mold resin, the protruding part of the heat sink becomes a physical obstacle. Thus, a mold for molding having a more complicated shape than a general metal mold for molding is required. Further, a process for separating the semiconductor device and the mold for molding from each other after the mold resin has been charged also becomes complicated. Therefore, there have been problems that manufacturing cost rises, productivity deteriorates, and product yield deteriorates.

The present invention has been made to solve the above-described problems, and is directed to obtaining a semiconductor device capable of ensuring reliability, decreasing the impedance of a lead terminal, reducing the manufacturing cost, and improving the productivity and the product yield.

Solution to Problem

A semiconductor device according to the present disclosure includes: a heat sink; a semiconductor chip provided on an upper surface of the heat sink; a lead terminal electrically connected to the semiconductor chip, not extending above a first side surface of the heat sink but extending above a second side surface of the heat sink; and mold resin covering the upper surface, the first side surface, and the second side surface of the heat sink, the semiconductor chip, and a part of the lead terminal, wherein a lower surface of the heat sink is exposed from the mold resin, an anchor structure in which a lower portion of the first side surface of the heat sink is recessed and is filled with the mold resin is provided, the anchor structure does not exist on the second side surface of the heat sink, and the heat sink does not protrude from a side surface of the mold resin.

Advantageous Effects of Invention

In the present disclosure, the anchor structure is provided on the first side surface of the heat sink. This makes it possible to prevent the heat sink from dropping from the mold resin, thereby ensuring reliability. The anchor structure does not exist on the second side surface of the heat sink above which the lead terminal extends. Thus, the impedance of each of the lead terminal can be reduced. The heat sink does not protrude from the side surface of the mold resin. As a result, general molding can be applied. Thus, the manufacturing cost can be reduced, and the productivity and the product yield can be improved.

DESCRIPTION OF EMBODIMENTS

A semiconductor device according to the embodiments of the present disclosure will be described with reference to the drawings. The same components will be denoted by the same symbols, and the repeated description thereof may be omitted.

Embodiment 1

Figure 1:
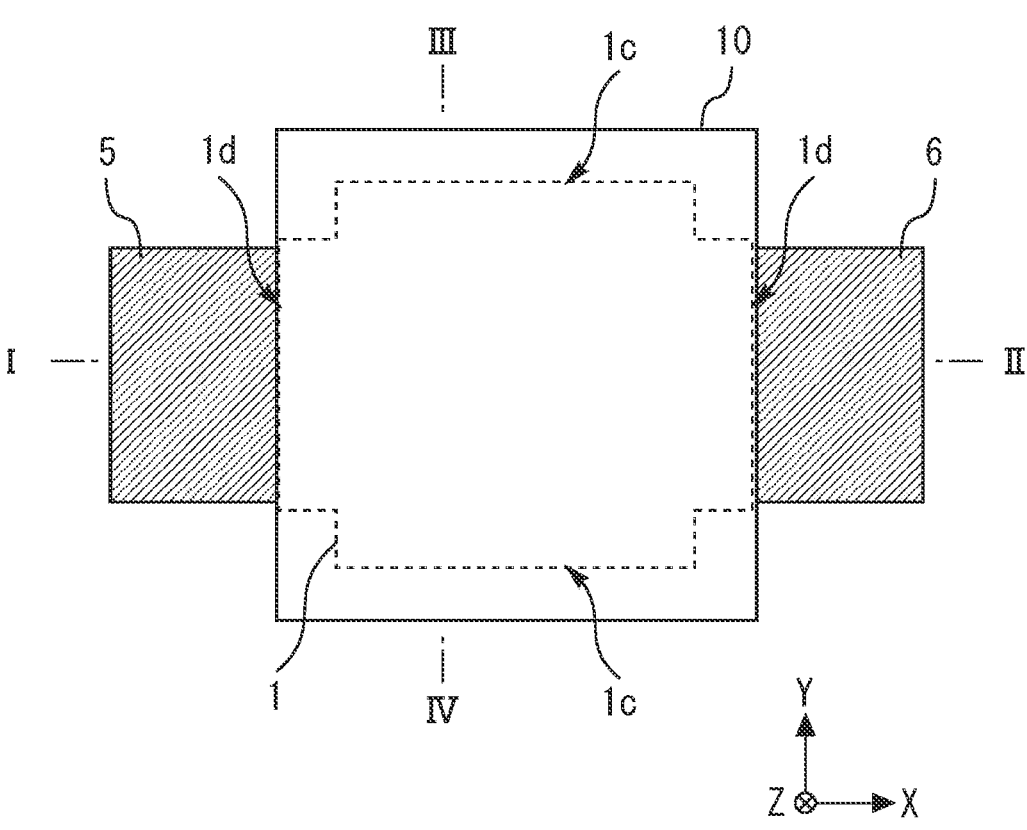
FIG. 1 is a plan view illustrating a semiconductor device according to Embodiment 1.
Figure 2:
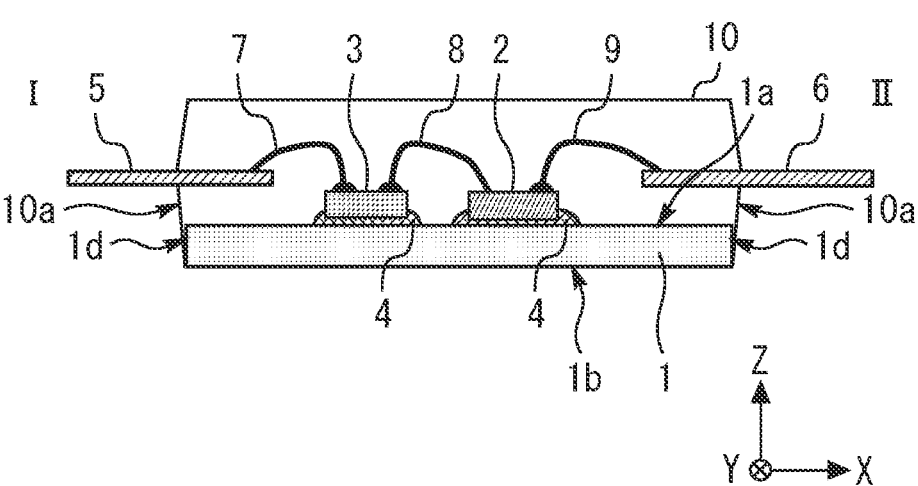
FIG. 2 is a cross-sectional view taken along a line I-II illustrated in FIG. 1.
Figure 3:
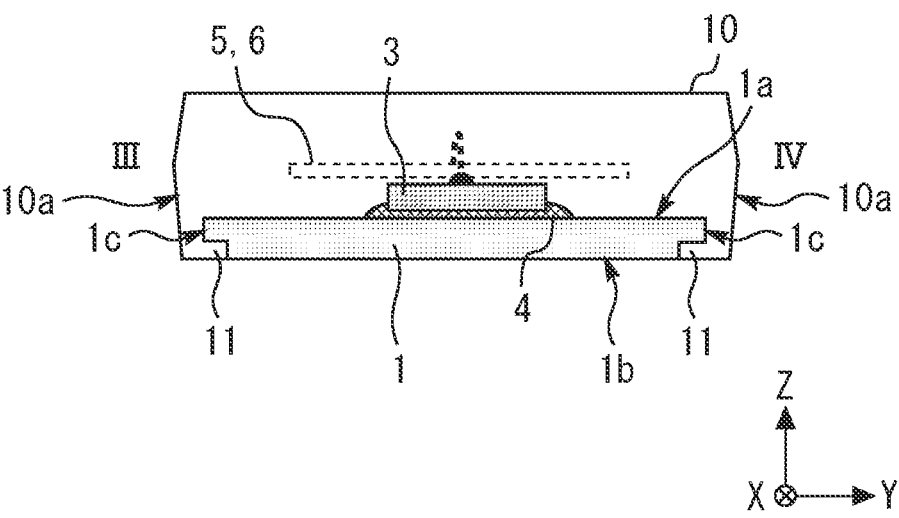
FIG. 3 is a cross-sectional view taken along a line III-IV illustrated in FIG. 1.

FIG. 1 is a plan view illustrating a semiconductor device according to Embodiment 1. FIG. 2 is a cross-sectional view taken along a line I-II illustrated in FIG. 1. FIG. 3 is a cross-sectional view taken along a line III-IV illustrated in FIG. 1. A heat sink 1 has an upper surface 1a as a mounting surface, a lower surface 1b as a heat radiation surface, and a first side surface 1c and a second side surface 1d that are perpendicular to each other. In the drawings, the upper surface 1a and the lower surface 1b of the heat sink 1 oppose each other in a Z-direction. The first side surface 1c includes two side surfaces that oppose each other in a Y-direction. The second side surface 1d includes two side surfaces that oppose each other in an X-direction.

A semiconductor chip 2 and a circuit board 3 are each provided using a die bond material 4 on the upper surface 1a of the heat sink 1. Examples of the die bond material 4 include Ag past resin, solder, and sintered Ag. The semiconductor chip 2 is a field effect transistor such as an Si-LDMOS chip, a GaAs FET chip, or a GaN HEMT suitable for high-frequency power amplifier applications.

Lead terminals 5 and 6 are arranged above the heat sink 1. The lead terminals 5 and 6 do not extend above the first side surface 1c of the heat sink 1 but extend above the second side surface 1d of the heat sink 1. The lead terminal 5 is electrically connected to the circuit board 3 via a bonding wire 7. The circuit board 3 is electrically connected to a gate electrode pad on an upper surface of the semiconductor chip 2 via a bonding wire 8. The lead terminal 6 is electrically connected to a drain electrode pad on the upper surface of the semiconductor chip 2 via a bonding wire 9. The bonding wires 7, 8, and 9 are each composed of a metal material such as Au, Ag, or Al.

The circuit board 3 is set to an optimum load impedance for the semiconductor chip 2 such that the semiconductor device operates with a high efficiency as a high-frequency power amplifier and high high-frequency power is outputted. Although the circuit board 3 is provided on the gate side of the semiconductor chip 2, the circuit board 3 is not limited to this, but may be provided between the drain electrode pad of the semiconductor chip 2 and the lead terminal 6 or may be provided on both the gate side and the drain side.

The heat sink 1 is electrically connected to a source electrode on the upper surface of the semiconductor chip 2, and also serves as a source electrode terminal. Examples of a method of connecting the heat sink 1 and the source electrode to each other include a method of connection via a through hole that penetrates the upper surface to a lower surface of the semiconductor chip 2 and a method of connecting a pad connected to the source electrode and the heat sink 1 to each other via a bonding wire.

Mold resin 10 covers the upper surface, the first side surface 1c, and the second side surface 1d of the heat sink 1, the semiconductor chip 2, and parts of the lead terminals 5 and 6. All the side surfaces and the upper surface of the heat sink 1 are encapsulated by the mold resin 10, and only the lower surface 1b as the heat radiation surface of the heat sink 1 is exposed from the mold resin 10. The heat sink 1 does not protrude from a side surface 10a of the mold resin 10.

Heat released from the semiconductor chip 2 and the circuit board 3 is conducted outward from the lower surface 1b of the heat sink 1. Therefore, the heat sink 1 is composed of Cu preferably having a thermal conductivity of 200 W/mK or more, for example, a high thermal conductivity of 398 W/mK. The semiconductor device having such a configuration is suitable for outputting high-frequency power of 1 W or more having a frequency of 1 GHz or more.

There is provided an anchor structure 11 in which a lower portion of the first side surface 1c of the heat sink 1 is recessed and is filled with the mold resin 10. The anchor structure 11 does not exist on the second side surface 1d of the heat sink 1. In a general method of manufacturing a heat sink, the heat sink is molded into desired dimensions by compression processing of a Cu material, as a base material, for example, using an upper mold and a lower mold. The heat sink and the molds need to be separable from each other after the compression processing, and such a constraint arises in a shape of the heat sink after the molding. A shape of the heat sink 1 in the present embodiment can be molded without complicating such a general manufacturing method.

A general example of a method of molding an outer shape of the semiconductor device is a method of injecting and charging the mold resin 10 into two metal molds for molding separated in a vertical direction with the lead terminals 5 and 6 used as a boundary from a predetermined injection port, and then separating the two molds for molding from each other in the vertical direction (Z-direction). To make it easy to pull the semiconductor device from the molds for molding, a taper is also generally provided in both the upper mold for molding and the lower mold for molding. Accordingly, the side surface 10a of the mold resin 10 is inclined in a tapered shape. A general taper angle is approximately 3° to 15°.

Figure 4:
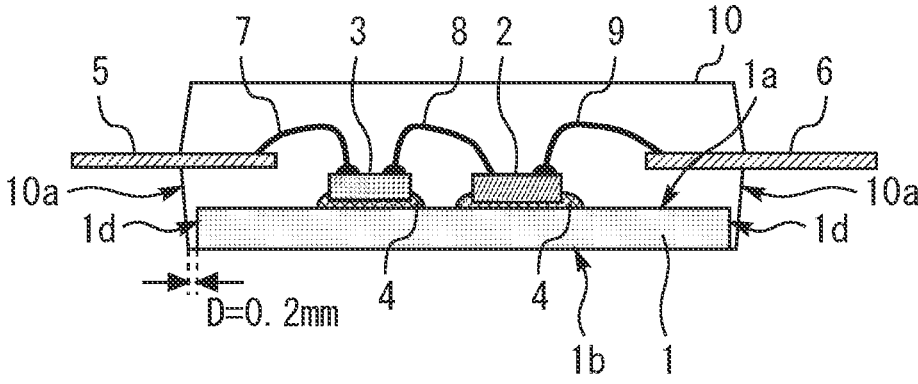
FIG. 4 is a cross-sectional view illustrating a modification of the semiconductor device according to Embodiment 1.

FIG. 4 is a cross-sectional view illustrating a modification of the semiconductor device according to Embodiment 1. In FIG. 2, a lower end of a second side surface 1d of a heat sink 1 and a lower end of a side surface 10a of a mold resin 10 are at the same position below lead terminals 5 and 6. Practically, the heat sink 1 needs to be reliably housed in a lower mold for molding, and needs to consider a dimensional tolerance. The dimensional tolerance to be considered mainly includes dimensions of the heat sink 1, dimensions of the lower mold for molding, and the like.

In a general manufacturing method, if the lower end of the second side surface 1d of the heat sink 1 is positioned at most 0.2 mm inside the lower end of the side surface 10a of the mold resin 10, the heat sink 1 can be reliably housed in the lower mold for molding. Therefore, a distance D between the lower end of the second side surface 1d of the heat sink 1 and the lower end of the side surface 10a of the mold resin 10 is set to 0.2 mm or less.

Figure 5:
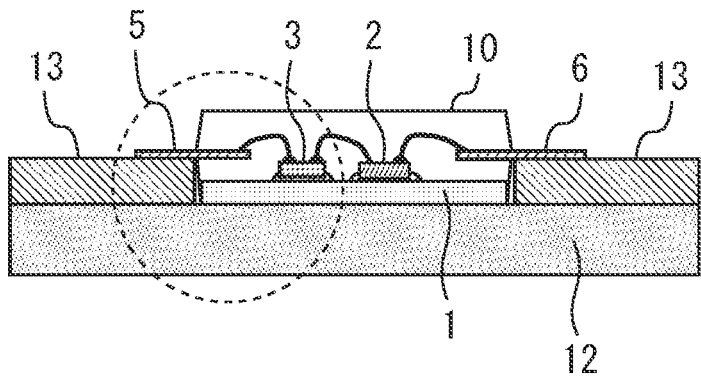
FIG. 5 is a cross-sectional view illustrating a state where the semiconductor device according to Embodiment 1 is mounted.
Figure 6:
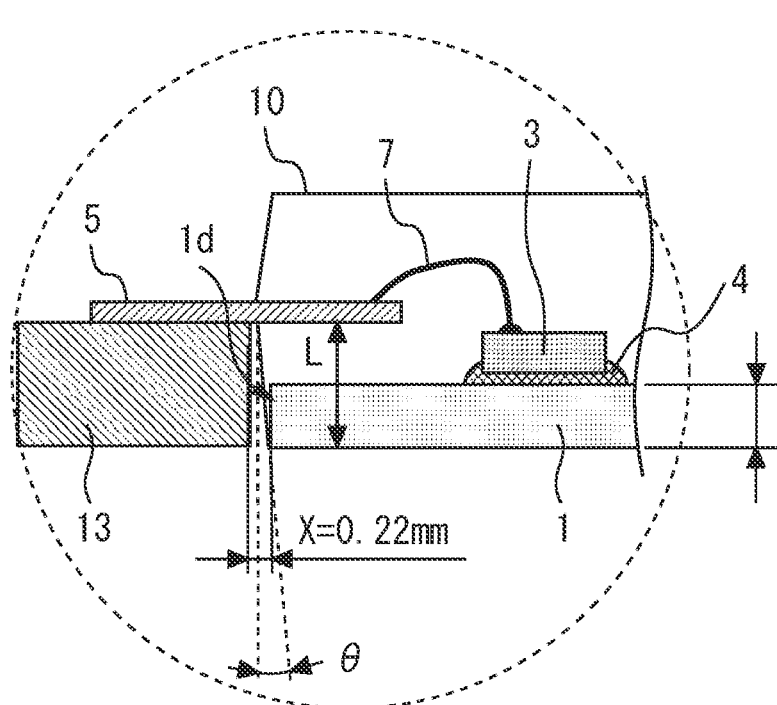
FIG. 6 is a cross-sectional view illustrating a part of FIG. 5 in an enlarged manner.

Then, an effect of the present embodiment will be described while being compared with those of comparative examples 1 and 2. FIG. 5 is a cross-sectional view illustrating a state where the semiconductor device according to Embodiment 1 is mounted. FIG. 6 is a cross-sectional view illustrating a part of FIG. 5 in an enlarged manner. The lower surface 1b of the heat sink 1 electrically connected to the source electrode of the semiconductor chip 2 is connected to a conductor 12. A lower surface of each of the lead terminals 5 and 6 in the semiconductor device is electrically connected to a substrate 13 used for matching.

Figure 7:
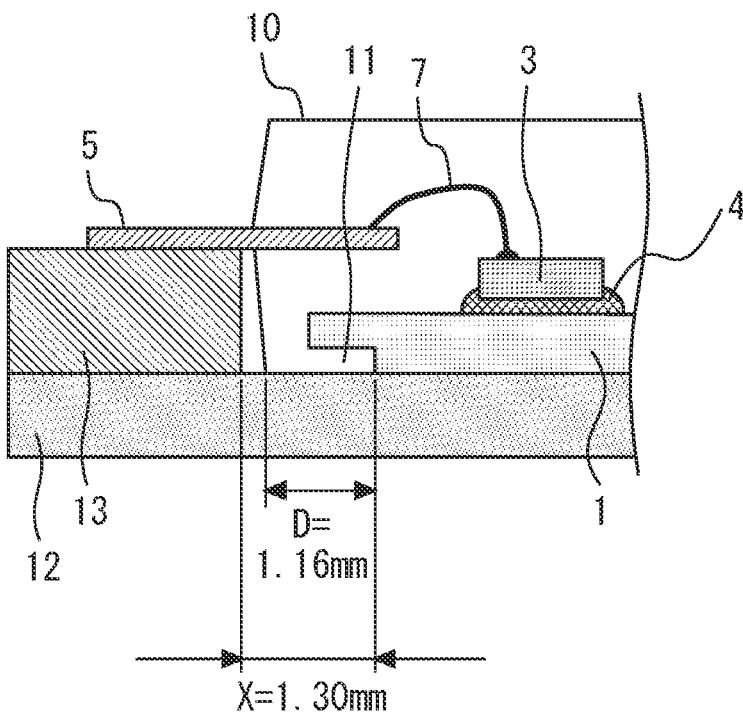
FIG. 7 is a cross-sectional view illustrating a semiconductor device according to a comparative example 1.

FIG. 7 is a cross-sectional view illustrating a semiconductor device according to a comparative example 1. In the comparative example 1, an anchor structure 11 is also provided below each of lead terminals 5 and 6. In the comparative example 1, when a heat sink 1 is grounded, a parasitic inductance component on the heat sink 1 side is superimposed. Accordingly, the impedance of each of the lead terminals 5 and 6 cannot be decreased to a desired level.

On the other hand, in the present embodiment, the anchor structure 11 does not exist on the second side surface 1d of the heat sink 1 above which the lead terminals 5 and 6 extend, and the lower end of the second side surface 1d of the heat sink 1 and the lower end of the side surface 10a of the mold resin 10 are at the same position. As a result, an effect of a parasitic inductance component on the heat sink 1 side can be reduced. Thus, the impedance of each of the lead terminals 5 and 6 can be reduced. The anchor structure 11 is provided on the first side surface 1c of the heat sink 1. This makes it possible to prevent the heat sink 1 from dropping from the mold resin 10, thereby ensuring reliability.

Figure 8:
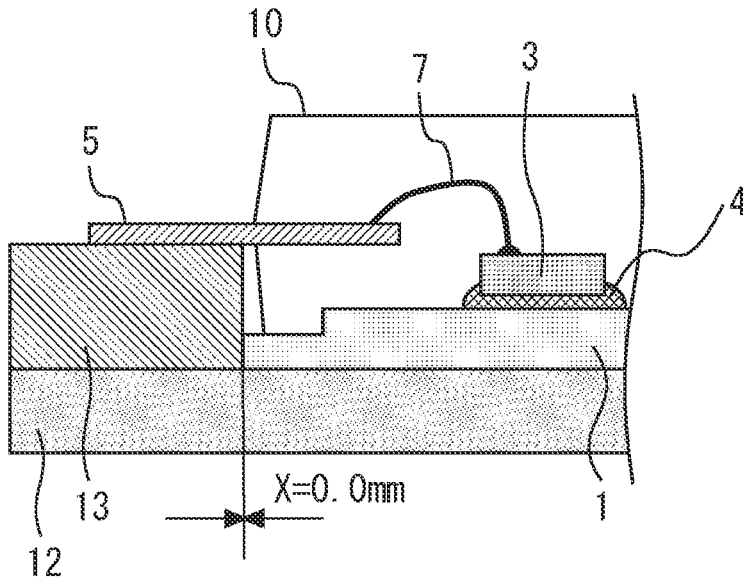
FIG. 8 is a cross-sectional view illustrating a semiconductor device according to a comparative example 2.

FIG. 8 is a cross-sectional view illustrating a semiconductor device according to a comparative example 2. In the comparative example 2, a heat sink 1 protrudes from a side surface of mold resin 10. Accordingly, a mold for molding having a complicated shape is required, and a process for separating the semiconductor device and the mold for molding from each other after the mold resin has been charged also becomes complicated. On the other hand, in the present embodiment, the heat sink 1 does not protrude from the side surface of the mold resin 10. As a result, general molding can be applied. Thus, the manufacturing cost can be reduced, and the productivity and the product yield can be improved. Therefore, the present embodiment is suitable for application in market fields requiring low cost.

Then, a simulation for confirming the effect of the present embodiment was performed. General epoxy resin was assumed as the mold resin 10, and its dielectric constant was set to 3.7. A taper angle $\theta$ of a side surface portion of the mold resin 10 was set to 8°, a distance L from the lower surface 1*b* of the heat sink 1 to the lower surface of each of the lead terminals 5 and 6 was set to 1.6 mm, and a thickness t of the heat sink 1 was set to 1.0 mm. At this time, a distance X between a lower end portion of the substrate 13 and the lower end of the second side surface 1*d* of the heat sink 1 is geometrically determined. In Embodiment 1, the distance X is 0.22 mm when D=0, and the distance X is 0.42 mm when D=0.22 mm. In the comparative example 1, the distance D is 1.16 mm, and the distance X is 1.3 mm. In the comparative example 2, the distance X is 0 mm.

Respective results of calculating impedances Z of the lead terminals in the semiconductor devices are summarized in Table 1.

TABLE 1

|  | Distance X | Impedance Z |
|---|---|---|
| Embodiment 1 (D = 0) | 0.22 mm | 18 Ω |
| Embodiment 1 (D = 0.2 mm) | 0.42 mm | 20.5 Ω |
| Comparative example 1 | 1.30 mm | 31 Ω |
| Comparative example 2 | 0.0 mm | 14 Ω |

The impedance Z of each of the lead terminals 5 and 6 in the comparative example 1 was highest, i.e., 31Ω, and was 2.21 times higher than that in the comparative example 2. When the impedance Z is increased, a band characteristic of a use frequency that is important in using the semiconductor device as a high-frequency power amplifier deteriorates. The impedance Z of each of the lead terminals 5 and 6 in the comparative example 2 was lowest, i.e., 14Ω. However, the comparative example 2 has problems that a method of manufacturing the semiconductor device is significantly difficult, as described above, and further a rise in cost cannot be avoided.

On the other hand, when D=0 in the present embodiment, the impedance Z was 18Ω, and was 1.29 times higher than that in the comparative example 2, but can be more significantly reduced than that in the comparative example 1. When D=0.2 mm in the present embodiment, the impedance Z of each of the lead terminals 5 and 6 was 20.5Ω. Although the impedance Z was 1.14 times higher than that when D=0, a sufficiently lower value than that in the comparative example 1 was obtained. Therefore, even when D=0.2 mm, the band characteristic of the use frequency could be prevented from deteriorating.

The distance X varies depending on the taper angle $\theta$ of the side surface 10*a* of the mold resin 10 and the distance L from the lower surface of the heat sink 1 to the lower surface of each of the lead terminals 5 and 6. The smaller the taper angle $\theta$ is and the smaller the distance L is, the smaller the distance X becomes. The smaller the distance X is, the lower the impedance Z of each of the lead terminals 5 and 6 can be made. However, the taper angle $\theta$ and the distance L are design parameters to be constrained by the manufacturing method or the like.

Embodiment 2

Figure 9:
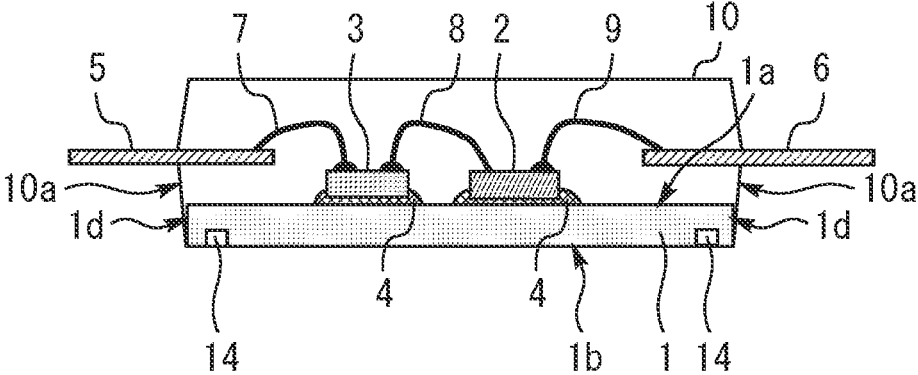
FIG. 9 is a cross-sectional view illustrating a semiconductor device according to Embodiment 2.

FIG. 9 is a cross-sectional view illustrating a semiconductor device according to Embodiment 2. The cross-sectional view corresponds to FIG. 2 in Embodiment 1. In Embodiment 1, the lower surface as the heat radiation surface of the heat sink 1 is flat. On the other hand, in the present embodiment, a recess 14 is provided on a lower surface of a heat sink 1. The recess 14 is filled with mold resin 10. As a result, an anchor effect can be further enhanced. Other components and effects are similar to those in Embodiment 1.

Embodiment 3

Figure 10:
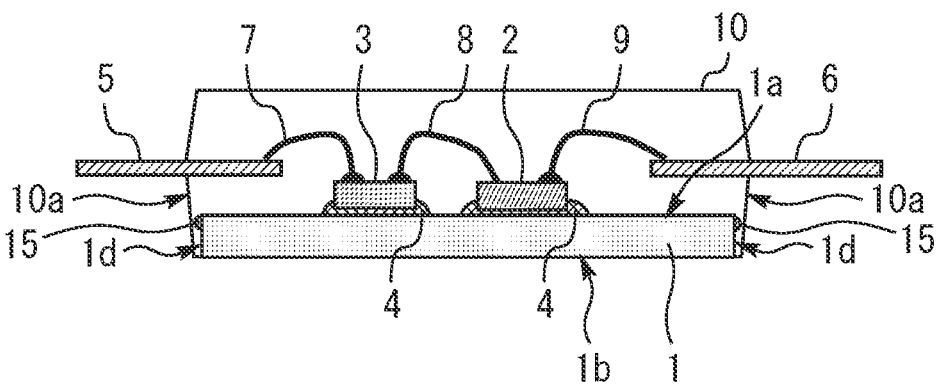
FIG. 10 is a cross-sectional view illustrating a semiconductor device according to Embodiment 3.

FIG. 10 is a cross-sectional view illustrating a semiconductor device according to Embodiment 3. The cross-sectional view corresponds to FIG. 2 in Embodiment 1. In the present embodiment, a protrusion 15 is provided on a second side surface 1*d* of a heat sink 1 below each of lead terminals 5 and 6. When the heat sink 1 is set in a lower mold for molding, a self-alignment function works by the protrusion 15. Therefore, controllability of a distance D between a lower end of the second side surface 1*d* of the heat sink 1 and a lower end of a side surface 10*a* of mold resin 10 is improved, whereby impedance of each of the lead terminals 5 and 6 can be prevented from varying. Other components and effects are similar to those in Embodiment 1.

REFERENCE SIGNS LIST

1 heat sink; 1*a* upper surface; 1*b* lower surface; 1*c* first side surface; 1*d* second side surface; 2 semiconductor chip; 5,6 lead terminal; 10 mold resin; 11 anchor structure; 14 recess; 15 protrusion

The invention claimed is:
1. A semiconductor device comprising:
a heat sink;
a semiconductor chip provided on an upper surface of the heat sink;
a lead terminal electrically connected to the semiconductor chip, not extending above a first side surface of the heat sink but extending above a second side surface of the heat sink; and
mold resin covering the upper surface, the first side surface, and the second side surface of the heat sink, the semiconductor chip, and a part of the lead terminal, wherein
a lower surface of the heat sink is exposed from the mold resin,
an anchor structure in which a lower portion of the first side surface of the heat sink is recessed and is filled with the mold resin is provided,
the anchor structure does not exist on the second side surface of the heat sink, the heat sink does not protrude from any side surface of the mold resin, the second side surface of the heat sink is transverse to the first side surface of the heat sink, and the second side surface of the heat sink is an outermost side surface of the heat sink in a plan view, the mold resin includes a first side surface that is adjacent to and extends in a direction parallel to a first direction that the second side surface of the heat sink extends, the mold resin includes a second side surface that is adjacent to and extends in a direction parallel to a second direction that the first side surface of the heat sink extends, a shortest distance from the second side surface of the heat sink to the first side surface of the mold resin is smaller than a shortest distance from the first side surface of the heat sink to the second side surface of the mold resin, and an entirety of the anchor structure is recessed a uniform distance in the first direction from an entirety of the first side surface of the heat sink that is above the anchor structure.

2. The semiconductor device according to claim 1, wherein the shortest distance between a lower end of the second side surface of the heat sink and a lower end of the first side surface of the mold resin is 0.2 mm or less.

3. The semiconductor device according to claim 1, wherein the lower surface of the heat sink includes an other portion that is recessed upward and filled with the mold resin.

4. The semiconductor device according to claim 1, wherein the first side surface of the mold resin and the second side surface of the mold resin are inclined in a tapered shape.

5. The semiconductor device according to claim 1, wherein the second side surface opposes an other second side surface and the second side surface and the other second side surface are each outermost side surfaces of the heat sink, the heat sink has a flat upper side surface extending from the second side surface to the other second side surface.

6. The semiconductor device according to claim 1, wherein an entirety of the second side surface of the heat sink is closer to the first side surface of the mold resin than an entirety of the first side surface of the heat sink is to the second side surface of the mold resin.

7. A semiconductor device comprising:

a heat sink;

a semiconductor chip provided on an upper surface of the heat sink;

a lead terminal electrically connected to the semiconductor chip, not extending above a first side surface of the heat sink but extending above a second side surface of the heat sink; and mold resin covering the upper surface, the first side surface, and the second side surface of the heat sink, the semiconductor chip, and a part of the lead terminal, wherein a lower surface of the heat sink is exposed from the mold resin, an anchor structure in which a lower portion of the first side surface of the heat sink is recessed and is filled with the mold resin is provided, the anchor structure does not exist on the second side surface of the heat sink, such that a lower portion of the second side surface of the heat sink is not recessed relative to an upper portion of the second side surface of the heat sink, the heat sink does not protrude from any side surface of the mold resin, and a protrusion is provided on the second side surface of the heat sink, the protrusion extending outwardly from the upper portion of the second side surface of the heat sink, and the lower portion of the second side surface of the heat sink is below the protrusion and positioned inward of the protrusion such that the lower portion below the protrusion is flush with the upper portion of the second side surface of the heat sink connected to the protrusion and flush with a portion of the upper portion of the second side surface of the heat sink above the protrusion.

8. The semiconductor device according to claim 7, wherein a distance from the protrusion to an outer surface of the mold resin is smaller than a distance from the lower portion of the second side surface of the heat sink below the protrusion to the outer surface of the mold resin.

* * * * *